United States Patent [19]

Bauer

[11] Patent Number: 4,871,644
[45] Date of Patent: Oct. 3, 1989

[54] PHOTORESIST COMPOSITIONS WITH A BIS-BENZOTRIAZOLE

[75] Inventor: Sigrid Bauer, Paudex, Switzerland

[73] Assignee: Ciba-Geigy Corporation, Ardsley, N.Y.

[21] Appl. No.: 99,880

[22] Filed: Sep. 22, 1987

[30] Foreign Application Priority Data

Oct. 1, 1986 [CH] Switzerland .................... 3918/86/7

[51] Int. Cl.$^4$ ............................................. G03C 1/60
[52] U.S. Cl. ................................... 430/191; 430/165; 430/189; 430/192; 430/190; 430/300; 430/302; 430/325; 430/326; 430/331
[58] Field of Search ............... 430/191, 165, 270, 189, 430/190, 192

[56] References Cited

U.S. PATENT DOCUMENTS

| | | | |
|---|---|---|---|
| 2,754,209 | 7/1956 | Schmidt et al. | 95/7 |
| 3,046,110 | 7/1962 | Schmidt | 96/33 |
| 3,046,112 | 7/1962 | Schmidt et al. | 96/33 |
| 3,046,113 | 7/1962 | Schmidt et al. | 96/33 |
| 3,046,116 | 7/1962 | Schmidt | 96/33 |
| 3,046,118 | 7/1962 | Schmidt | 96/33 |
| 3,046,119 | 7/1962 | Süs | 96/33 |
| 3,046,120 | 7/1962 | Schmidt et al. | 96/33 |
| 3,531,414 | 9/1970 | Randell et al. | 252/152 |
| 3,637,584 | 1/1972 | Hurlock et al. | 260/45.85 |
| 3,647,443 | 3/1972 | Rauner et al. | 96/33 |
| 3,661,582 | 5/1972 | Broyde | 96/36.2 |
| 3,759,711 | 9/1973 | Rauner et al. | 96/33 |
| 3,859,099 | 1/1975 | Petropoulos et al. | 430/190 |
| 4,059,449 | 11/1979 | Rosenkranz et al. | 430/191 |
| 4,141,733 | 2/1979 | Guild | 96/49 |
| 4,365,019 | 12/1982 | Daly et al. | 430/190 |

FOREIGN PATENT DOCUMENTS

| | | | |
|---|---|---|---|
| 211350 | 2/1987 | European Pat. Off. | 430/191 |
| 56-36648 | 4/1981 | Japan | 430/191 |
| 1546633 | 5/1979 | United Kingdom . | |

OTHER PUBLICATIONS

Chem. Abst., 59 4663a.
Chem. Abst., 69, 32036g (1968).
Chem. Abst., 72, 61420v (1970).
Chem. Abst., 73, 20460k (1970).

*Primary Examiner*—Charles L. Bowers, Jr.
*Attorney, Agent, or Firm*—Harry Falber

[57] ABSTRACT

Photoresist compositions which operate positively and contain at least one ocmpound of the formula I

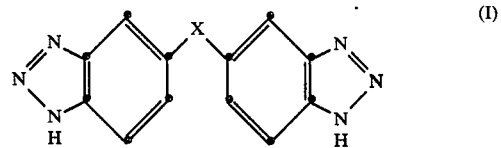

(I)

in which X is $-C_nH_{2n}-$, $-O-$, $-S-$ or $-C(O)-$, n being a number from 1 to 6. These compositions are particularly suitable for use as positively-operating copying lacquers.

3 Claims, No Drawings

PHOTORESIST COMPOSITIONS WITH A BIS-BENZOTRIAZOLE

The present invention relates to photoresist compositions which operate positively and contain, as the development accelerator, a bisbenzotriazole, to a process for the production of positive images and to the use of these bisbenzotriazoles as development accelerators in positive photoresists.

The semiconductor industry nowadays requires copying lacquers which are not only distinguished by great sensitivity but are also resistant to fairly high temperatures. In order to ensure mass production, the time required for production must be kept as short as possible. The systems used up to the present have the disadvantage that the compositions are either more difficult to develop or have to be exposed for a longer time in order to improve their capacity for development.

Attempts have already been made to accelerate development by adding chemical compounds. Aromatic heterocyclic compounds, including, for example, benzotriazole, are described as development assistants in U.S. Pat. No. 3,661,582. It is described in U.S. Pat. No. 4,365,019 that benzotriazoles carrying two to four halogen atoms in the benz moiety can be used with particular advantage in photoresist compositions which operate positively.

The present invention relates to photoresist compositions which operate positively and contain at least one compound of the formula I

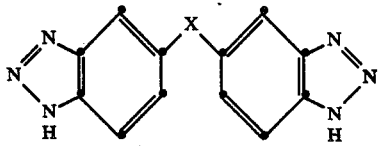

in which X is $-C_nH_{2n}-$, $-O-$, $-S-$ or $-C(O)-$, n being a number from 1 to 6.

The compounds of the formula I are known and are described, for example, in U.S. Pat. No. 3,531,414. They can be prepared by the methods described therein and have ben employed hitherto as anti-corrosion agents in the treatment of metal surfaces.

It is particularly preferable to employ compounds of the formula I in which X is $-C_nH_{2n}-$ and especially $-CH_2-$.

The compound of the formula I in which X is $-S-$ is also worthy of mention.

No compatibility problems arise when used according to the invention, in spite of the relatively high molecular weight. The bisbenzotriazoles to be employed in accordance with the invention are superior to known compounds in respect of melting point, volatility and/or solubility, and they can be used widely. As shown in Example 2, an image reversal is also possible through "two-stage exposure to light", whereby a complementary image of the positive original is obtained.

Photoresist compositions have been described in numerous publications, for example in DeForest, "Photoresist Materials and Processes", McGraw-Hill Book Company, N.Y., 1975. These embrace coatings prepared from a solution or coatings applied as a dry film. The positively-operating resist becomes soluble in the developer after being exposed to activating radiation.

Positively-operating photoresists consist essentially of a light-sensitive compound in a film-forming polymeric binder. These can be physical mixtures or reaction products, so-called diazo resins. The light-sensitive compounds or sensitizers most frequently used have been disclosed as quinone diazides. These are, in particular, esters and amides of o-quinone diazidecarboxylic acids and especially diazidesulfonic acids. Examples of suitable sensitizers of this type are described in DeForest (loc. cit., cf. pages 47–55) and in the following U.S. Pat. Nos.: 2,754,209; 3,046,110; 3,046,112; 3,046,113; 3,046,116; 3,046,118; 3,046,119; 3,046,120; 3,647,443; 3,759,711 or 4,141,733. These are preferably naphthoquinone diazides and especially o-naphthoquinone-4-sulfonic or o-naphthoquinone5-sulfonic acid derivatives. The monomeric quinone diazidesulfonic acids are incorporated into the binder in the form of their esters or amides, or a quinone diazidesulfonyl chloride, for example, is reacted with the binder, as is described, for instance, in U.S. Pat. No. 4,141,733 or British Patent Specification No. 1,546,633. The latter products are known as diazo resins.

The choice of the binder is made on the basis of the field of use and the properties required for this use. A composition of possible resins can be found in DeForest (loc. cit., pages 57–59).

Examples of particularly suitable binders are novolacs derived from an aldehyde, preferably acetaldehyde or formaldehyde, but particularly formaldehyde, and a phenol. The phenolic component of these binders is preferably phenol itself or halogenated phenol, for example phenol which has been substituted by one or two chlorine atoms, preferably p-chlorophenol, or it is a phenol which has been substituted by one or two $C_1$–$C_9$-alkyl groups, for example o-, m- or p-cresol, a xylenol, p-tert.-butylphenol or p-nonylphenol. The phenol component of the preferred novolacs can, however, also be p-phenylphenol, resorcinol, bis-(4-hydroxyphenyl)methane or 2,2-bis-(4-hydroxyphenyl)-propane. Some of the phenolic hydroxyl groups of these novolacs can, if appropriate, be modified by reaction with chloroacetic acid, isocyanates, epoxides or carboxylic acid anhydrides.

Examples of other suitable binders are polyvinylphenols or copolymers of maleic anhydride with styrene or with vinyl ethers or 1-alkenes, or copolymers of hydroxystyrene or aminostyrene with styrene, vinyl acetate and the like.

The binders employed can also be copolymers of esters of acrylic acid or methacrylic acid with ethylenically unsaturated acids, for example methacrylic acid or acrylic acid.

The expression diazo resin is used to describe binders which carry light-sensitive quinone diazide substituents. These are, therefore, not physical mixtures of light-insensitive binders and light-sensitive compounds, but light-sensitive binders which can be obtained by reacting a light-insensitive binder with a light-sensitive compound, in particular a reactive quinone diazide, for example an o-naphthoquinone diazidesulfochloride. Such diazo resins are described, for example, in U.S. Pat. Nos. 3,046,120 and 4,141,733; British Patent Specification Nos. 1,026,144 and 1,113,759; and German Patent Specification Nos. 1,803,712 and 1,911,497; or Canadian Patent Specification No. 903,545, and they can be prepared by the methods described therein.

Phenol/formaldehyde or cresol/formaldehyde resins, polyvinylphenols or aminostyrene or hydroxystyrene copolymers, for example copolymers with styrene, vinyl acetate and the like, are particularly suitable for the reaction with a light-sensitive, reactive quinone diazide, for example o-naphthoquinone diazide-4-sulfochloride or napthoquinone diazide-5-sulfochloride.

If desired, it is also possible to add further additive resins to the alkali-soluble binders or azo resins, as is customary in positive systems. These additive resins include, for example, vinyl polymers, such as polyvinyl acetate, polyacrylates, poly-(methacrylic acid alkyl esters) or poly-(acrylic acid/alkyl esters), alkyl meaning $C_1$–$C_{20}$-alkyl, polyvinyl ethers or polyvinylpyrrolidones. In general, however, not more than 20% by weight of these additive resins is added, relative to the amount of alkali-soluble binder.

For example, as a rule 1–15% by weight, in particular 2–10% by weight, of the development accelerator are employed, relative to the total solids.

The compositions according to the invention can contain further customary additives, for example stabilizers, pigments, dye, fillers, adhesion promoters, flow control agents, wetting agents and plasticizers. The compositions can also be dissolved in suitable solvents for application.

The compositions according to the invention are excellently suitable for use as coating agents for substrates of all types, for example wood, textiles, paper, ceramics, glass, plastics, such as polyesters, polyethylene terephthalate, polyolefins or cellulose acetate, especially in the form of films, and metals, such as Al, Cu, Ni, Fe, Zn, Mg or Co, and Si or $SiO_2$, to which an image is to be applied by image-wise exposure to light. The present invention also relates to the coated susbtrates.

The invention also relates to a process for the production of positive images which embraces the following operational steps:
(a) coating a substrate with a radiation-sensitive composition as defined above,
(b) exposing the coated substrate together with a predeterminded pattern to actinic radiation, and
(c) developing the exposed substrate.

The preparation of the coated substrates can be effected, for example, by preparing a solution or suspension of the composition. The choice of solvent and the concentration depend mainly on the nature of the composition and on the coating process. The solution is applied uniformly to a substrate by means of known coating processes, for example by whirler-coating, dipping, doctor blade coating, curtain coating processes, brushing, spraying and reverse roll coating. It is also possible to apply the light-sensitive layer to a temporary, flexible carrier, and then to coat the final substrate, for example a copper-coated printed circuit board, by layer transfer via lamination.

The amount applied (layer thickness) and the nature of the substrate (layer support) depend on the desired field of application. A particularly advantageous aspect is that the compositions according to the invention can be employed in widely varying layer thicknesses.

Possible fields of use for the compositions according to the invention are use as photoresists for electronic processes (plating resists or etch resists), the production of printing plates, such as offset printing plates for halftone gravure printing or for roller printing and also for the production of screen printing formes, use in chemical milling or use as microresists in the production of integrated switching circuits.

The possible layer carriers and processing conditions for the coated substrates vary accordingly.

For example, films of polyester or cellulose acetate or paper coated with plastics are used for photographic recording of information; specially treated aluminium is used for offset printing formes, and copper-coated laminates are used for the production of printed circuits.

After the coating process, the solvent is, as a rule, removed by drying, which results in a layer of the photoresist on the carrier.

After the material has been exposed imagewise to light in a customary manner, the exposed areas of the photosensitive resist lacquer are removed by being dissolved out in a developer.

Aqueous alkaline solutions, such as are employed for the development of naphthoquinone diazide layers, are particularly preferred as the developer. These include, in particular, aqueous solutions of alkali metal silicates, phosphates and hydroxides or trialkylammonium compounds. If desired, it is also possible to add minor amounts of wetting agents and/or organic solvents to these solutions.

Typical organic solvents are those which are miscible with water and can be added to the developer liquids, for example 2-ethoxyethanol or acetone, and also mixtures of two or more of such solvents.

The term "exposure together with a predetermined pattern to actinic radiation" comprises not only exposure through a photomask containing a predetermined pattern, for example a diapositive, but also exposure by means of a laser beam which is moved over the surface of the coated substrate, for example under computer control, and in this manner produces an image.

The sensitivity to light of the compositions according to the invention extends, as a rule, from the UV region (approx. 250 nm) to approx. 600 nm and thus covers a very wide range. A large number of very different types of light sources can therefore be used. Both point sources of light and sheetlike sources of radiation (lamp carpets) are suitable. Examples are: carbon arc lamps, xenon arc lamps, mercury vapour lamps, if appropriate doped, with metal halides (metal halogen lamps), fluorescent lamps, argon incandescent lamps, electronic flash lamps and photographic floodlight lamps. The distance between lamps and the image material according to the invention can vary with the end use and the type or strength of lamps, for example from 2 cm to 150 cm. Laser light sources, for example argon ion lasers or krypton ion lasers having strong emission lines (Ar lasers) at 457, 476, 488, 514 and 528 nm, are particularly suitable. With this type of exposure it is no longer necessary to have a photomask in contact with the photosensitive polymer layer; the controlled laser beam writes directly onto the layer. A very advantageous factor here is the high sensitivity of the materials according to the invention, which permits high writing speeds at relatively low intensities. Printed circuits for the electronics industry, lithographic offset printing plates or relief printing plates and photographic image recording materials can be produced by this method.

The invention therefore also relates to the use of the compositions as defined above as positive photoresists for the production of positively-operating copying lacquers which are used, for example for the production of integrated circuits, etch resists, offset printing plates, colour testing films, stencils, nameplates etc.

EXAMPLE 1

A coating solution (I) consisting of
- 10.50 parts by weight of a cresol/formaldehyde novolac having a softening point of 110°–120° C.,
- 2.00 parts by weight of an epoxide resin having an epoxy value of 2.0–2.2,
- 1.25 parts by weight of the esterification product formed from 1 mol of 2,3,4-trihydroxybenzophenone and 2.5 mol of 1,2-naphthoquinone-2-diazide-5-sulfochloride,
- 0.09 part by weight of Crystal Violet (colour index No. 42,555) and
- 35.60 parts by weight of a solvent mixture composed of ethylglycol, ethylglycol acetate and methyl ethyl ketone (in a ratio of 2:2:1)

is made up and is applied by means of a wire applicator to a copper-coated base material; dry film thickness: 2 μm.

A coating solution (II) is also made up, in which, additionally, 0.6 part by weight of 5,5'-methylenebisbenzotriazole has been added to a formulation of the same composition as solution (I). This solution is also applied by means of a wire applicator to a copper-coated base material, and is dried; dry film thickness: 2 μm.

The samples coated with the solutions (I) and (II) are exposed for six seconds, under a Stauffer 21-step grey wedge, to a 5 KW metal halide lamp, and are developed with the developers listed below.

Developer: A
- 40.0 parts by weight of demineralized water
- 40.0 parts by weight of anhydrous $Na_3PO_4$ and
- 20.0 parts by weight of sodium metasilicate . 5 $H_2O$

Developer: B
- 1,000.0 parts by weight of demineralized water
- 50.0 parts by weight of sodium metasilicate . 5 $H_2O$ and
- 2.5 parts by weight of sodium hydroxide

Developer: C

"MICROPOSIT ®303", developer made by Shipley Co., Inc.

The table below indicates the time required for clean development and the (first) full step reached within this time.

| Developer/coating solution | | I | II |
|---|---|---|---|
| A | | 150" (11) | 60" (11) |
| B | | 50" (12) | 25" (12) |
| C/water | 1:3 | 25" (13) | 15" (14) |
| | 1:5 | 50" (13) | 20" (14) |
| | 1:6 | 75" (12) | 30" (14) |

(full shade step, measured)

Result: The addition of 5,5'-methylenebisbenzotriazole shortens the development time considerably.

EXAMPLE 2

A coating solution consisting of:
- 10.50 parts by weight of a cresol/formaldehyde novolac having a softening point of 110°–120° C.,
- 0.50 part by weight of an epoxide resin having an epoxy value of 2.0–2.2,
- 1.50 parts by weight of a copolymer formed from methyl methacrylate/methacrylic acid (75:25),
- 1.25 parts by weight of the esterification product formed from 1 mol of 2,2',4,4'-tetrahydroxybenzophenone and 2 mol of 1,2-naphthoquinone-2-diazide-5-sulfochloride,
- 0.30 part by weight of 5,5'-methylenebisbenzotriazole, 0.09 part by weight of Crystal Violet (colour index No. 42, 555) and
- 35.60 parts by weight of a solvent mixture consisting of ethylglycol, ethylglycol acetate and methyl ethyl ketone (2:2:1)

is made up and is applied by means of a wire applicator to aluminium sheet of thickness 0.1 mm, and is dried. The coating is then exposed for 6 seconds, under a photographic positive original, to a metal halide lamp and is then dried for 5 minutes at 120° C.

For the purposes of "image reversal" the layer is then exposed over its whole surface for 10 seconds and is subsequently developed with the developer designated A in Example 1, diluted 1:1 with water. A complementary image of the positive original is formed on the positive layer which has been exposed under a positive original.

EXAMPLE 3

A coating solution (III) consisting of:
- 6.00 parts by weight of an esterification product formed from a cresol/formaldehyde novolac with 1,2-naphthoquinone-2-diazide-5-sulfochloride, nitrogen content ~ 1.5%,
- 14.00 parts by weight of 1-methoxy-2-propanol and
- 0.04 part by weight of Crystal Violet (colour index No. 42,555)

is made up and is applied to aluminium sheet of thickness 0.1 mm, and is dried.

As a comparison with this, a coating solution (IV) is made up from a similar coating solution (III) to which 0.3 part by weight of 5,5'-methylenebisbenzotriazole has been added, and is also applied by means of a wire applicator to an aluminium sheet, and is dried.

The samples are exposed as in Example 1 and are developed using the Developer A described in Example 1 and using:

Developer: D

"MICROPOSIT ®MF 314", developer made by Shipley Co., Inc., and

Developer: E known by the trade name of KODAK micro positive developer ® 809, made by Eastman Kodak Company.

The table below indicates the time required for clean development and the (first) full shade step reached within this time.

| Developer/coating solution | III | IV |
|---|---|---|
| A | 45" (7) | 20" (7) |
| A/water: 1:1 | 3' ND | 100" (6) |
| D | 60" (7) | 30" (7) |
| E/water 1:1 | 120" (6) | 45" (8) |
| 1:2 | 3' ND | 120" (7) |

*ND: not developed in the time shown

EXAMPLE 4

A coating solution (V) consisting of:

6.00 parts by weight of an esterification product formed from a cresol/formaldehyde novolac by means of 1,2-naphthoquinone-2-diazide-5-sulfochloride, nitrogen content 1.6%, 1.50 parts by weight of a styrene/maleic anhydride copolymer, trade name Scripset ® 550, 0.04 part by weight of Crystal Violet (colour index No. 42,555) and 16.30 parts by weight of 1-methoxy-2-propanol is made up and is applied to bare aluminium sheet and is dried.

As a comparison with this, a coating solution (VI) consisting of a similar coating solution (V) to which 0.3 part by weight of 5,5'-methylenebisbenzotriazole has been added is made up and is also applied by means of a wire applicator to an aluminium sheet, and is dried.

The samples are exposed for 12 seconds, under a grey wedge, to a 5 KW metal halide lamp, and are developed in a rocking bath using the Developer A described in Example 1 and the developers D and E mentioned in Example 3. The plates are wiped gently with a cotton swab, rinsed with water and then dried.

| Developer/coating solution | V | VI |
|---|---|---|
| A | 120" (9) | 60" (9) |
| A/water: 1:1 | 180" (S) | 180" (8) |

| Developer/coating solution | V | VI |
|---|---|---|
| D | 60" (8) | 30" (8) |
| E/water: 1 | 150" (10) | 90" (10) |
| 1:2 | 180" (S) | 180" (9) |
| 1:3 | 180" (S) | 180" (8) |

The table above indicates the time required for clean development and the (first) full shade step reached within this time.

(S) indicates haze, which could not be removed in spite of wiping.

What is claimed is:

1. A photoresist composition which operates positively and comprises a mixture of a light sensitive o-quinone diazide compound present in sufficient amount to produce a positive resist image, and of from 1 to 15 percent by weight, based on the total solids in the compositions, of at least one compound of the formula I

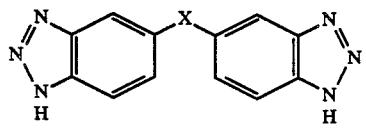

in which X is $-C_nH_{2n}-$, $-O-$, $-S-$ or $-C(O)-$, n being a number from 1 to 6.

2. A composition according to claim 1, in which X in the formula I is $-C_nH_{2n}-$.

3. A composition according to claim 2, in which X is $-CH_2-$.

* * * * *